US009793900B1

(12) United States Patent
Fiedler

(10) Patent No.: US 9,793,900 B1
(45) Date of Patent: Oct. 17, 2017

(54) DISTRIBUTED MULTI-PHASE CLOCK GENERATOR HAVING COUPLED DELAY-LOCKED LOOPS

(71) Applicant: Microsoft Technology Licensing, LLC, Redmond, WA (US)

(72) Inventor: Alan Fiedler, Mountain View, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/196,581

(22) Filed: Jun. 29, 2016

(51) Int. Cl.
*H03K 5/15* (2006.01)
*H03L 7/07* (2006.01)
*H03L 7/093* (2006.01)
*H03L 7/081* (2006.01)

(52) U.S. Cl.
CPC ............. *H03L 7/07* (2013.01); *H03K 5/1508* (2013.01); *H03L 7/0812* (2013.01); *H03L 7/093* (2013.01)

(58) Field of Classification Search
CPC ....... H03K 5/1508; H03L 7/07; H03L 7/0812; H03L 7/093
USPC ....... 327/144, 146, 149, 150, 153, 291, 295, 327/296, 297
See application file for complete search history.

(56) References Cited

U.S. PATENT DOCUMENTS

| 6,131,168 | A | 10/2000 | Krzyzkowski |
| 7,323,918 | B1 | 1/2008 | Tai |
| 2002/0085658 | A1 | 7/2002 | Boerstler |
| 2003/0155953 | A1 | 8/2003 | Hirata et al. |
| 2005/0189974 | A1 | 9/2005 | Chao |
| 2006/0203605 | A1 | 9/2006 | Lee |
| 2007/0096784 | A1* | 5/2007 | Hasegawa ................. H03L 7/07 327/158 |
| 2007/0164797 | A1 | 7/2007 | Law et al. |
| 2007/0170967 | A1 | 7/2007 | Bae et al. |
| 2008/0013664 | A1 | 1/2008 | Wang |
| 2008/0144760 | A1 | 6/2008 | Song et al. |
| 2008/0303576 | A1 | 12/2008 | Chueh et al. |
| 2009/0002041 | A1 | 1/2009 | Lin et al. |
| 2009/0295441 | A1 | 12/2009 | Kwak |
| 2010/0013530 | A1 | 1/2010 | Kim et al. |

(Continued)

FOREIGN PATENT DOCUMENTS

WO 2005008894 A1 1/2005

OTHER PUBLICATIONS

Gao, et al., "Precise Multiphase Clock Generation Using Low-Jitter Delay-Locked Loop Techniques for Positron Emission Tomography Imaging", In Journal of IEEE Transactions on Nuclear Science, vol. 57, No. 3, Jun. 2010, pp. 1063-1070.

(Continued)

*Primary Examiner* — William Hernandez

(57) ABSTRACT

Multiple, distributed, clock generating delay-locked loop (DLL) elements are interconnected/coupled in such a way as to reduce the amount of phase error present in the clocks output by these DLL elements. A plurality of DLL elements are interconnected/coupled such that a root input clock is successively relayed down a series of DLL elements. The output clocks from each of these DLL elements are interconnected/coupled to phase-corresponding output clocks from DLL elements in the series. This reduces the amount of phase error on these output clocks when compared to DLL elements that do not have outputs coupled to each other.

20 Claims, 8 Drawing Sheets

(56) References Cited

U.S. PATENT DOCUMENTS

2010/0052744 A1  3/2010  Fiedler
2013/0093476 A1  4/2013  Fujimori
2013/0120186 A1  5/2013  Rentala et al.
2016/0065196 A1  3/2016  Fiedler

OTHER PUBLICATIONS

Cheng, et al., "A Fast-Lock Wide-Range Delay-Locked Loop Using Frequency-Range Selector for Multiphase Clock Generator", In Journal of IEEE Transactions on Circuits and Systems II: Express Briefs, vol. 54, No. 7, Jul. 2007, pp. 561-565.

* cited by examiner

DISTRIBUTED MULTI-PHASE CLOCK GENERATOR HAVING COUPLED DELAY-LOCKED LOOPS

BACKGROUND

High-speed data serialization, transmission, reception, and deserialization can involve multiple high-frequency timing references (e.g., clocks). These timing references may be generated from lower-frequency clocks. For example, a low-frequency clock (e.g., 10 MHz) may be transmitted as the timing reference for receiving a data stream that has a bit rate that is a multiple of the low-frequency clock (e.g., 80 Mbit/s).

SUMMARY

Examples discussed herein relate to a multi-phase clock generator to generate N*M number of output clocks. This clock generator includes N number of delay-locked loop elements. Each of these delay-locked loop elements has a respective root clock input and a respective root clock output. The N delay-locked loop elements may be numbered n=1 to N in order of ascending phase at their respective root clock inputs. For each delay-locked loop element, the root clock output of the delay-locked loop element numbered n is coupled to the root clock input of the delay-locked loop element numbered n+1 (except when n=N). The root clock input of the delay-locked loop element numbered n=1 receives a master input clock. In addition, each delay-locked loop element is configured to produce M number of output clocks, where N is an integer greater than one, and M is an even integer greater than three. Each of the M output clocks of a respective delay-locked loop element has a phase. The M output clocks may be numbered m=1 to M in order of ascending phase. The phase of a respective output clock numbered m+1 substantially equals the phase of a respective output clock numbered m plus 360/M degrees. Each respective output clock numbered m of the respective delay-locked loop element numbered n is coupled to output clock numbered m−1 of delay-locked loop element numbered n+1 (except that when m=1 the respective output clock numbered m=1 is coupled to the output clock numbered m=M of delay-locked loop element numbered n+1). The phase of a respective root clock output signal substantially equals the phase of a respective root clock input signal plus 360/M degrees.

In an example, a distributed multi-phase clock generator includes a first delay-locked loop element. This first delay-locked loop element is to receive a master input clock and to produce a first set of M output clocks. The first set of output clocks are to be delay-locked from the master input clock such that the master input clock is divided into M number of substantially equal time intervals. A second delay-locked loop element is to receive a second input clock from the first delay-locked loop element. This second delay-locked loop element is to produce a second set of at least M output clocks. The second set of output clocks are to be delay-locked from the second input clock such that the second input clock is divided into M substantially equal time intervals. The second input clock corresponds to the master input clock delayed by one of the M time intervals. The distributed clock generator also includes coupling between respective ones of the first set of output clocks and the second set of output clocks. This coupling is configured so that the first set of output clocks are each coupled to the second set of output clocks such that output clocks with corresponding phase are coupled together.

In an example, a method of generating distributed multi-phase output clocks includes providing a master input clock signal to a root clock input of a first delay-locked loop element. A first delay of P number of delay cells of the first delay-locked loop element are adjusted to produce a first set of M output clocks that divide the master input clock into 360/M degree intervals. The master input clock signal is delayed by the 360/M degree interval to produce a first root clock output signal from the first delay-locked loop element. The first root clock output signal is provided to a root clock input of a second delay-locked loop element. A second delay of P delay cells of the second delay-locked loop element is adjusted to produce a second set of M output clocks that divide the first root clock output signal into 360/M degree intervals. The first set of M output clocks are coupled to the second set of M output clocks such that at least one of the first set of M output clocks is coupled to one of the second set of M output clocks that has the same number of 360/M intervals of delay from the master input clock.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

In order to describe the manner in which the above-recited and other advantages and features can be obtained, a more particular description is set forth and will be rendered by reference to specific examples thereof which are illustrated in the appended drawings. Understanding that these drawings depict only typical examples and are not therefore to be considered to be limiting of its scope, implementations will be described and explained with additional specificity and detail through the use of the accompanying drawings.

DETAILED DESCRIPTION OF THE EMBODIMENTS

Figure 1:
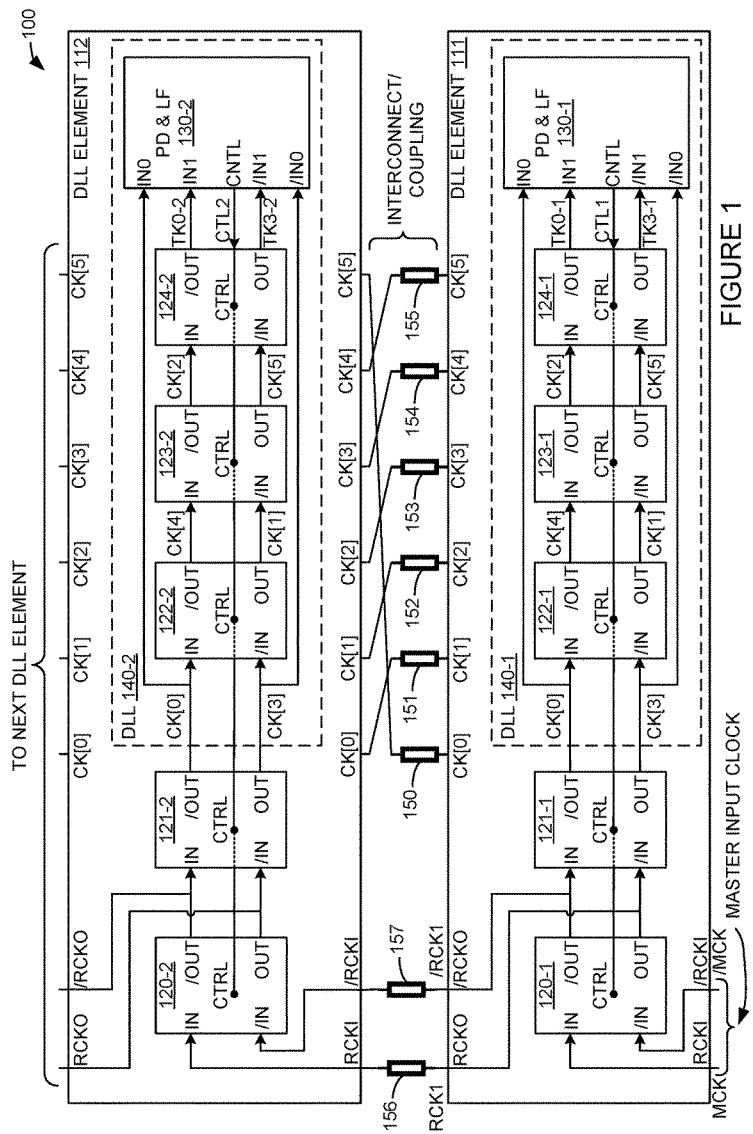
FIG. 1 is a block diagram illustrating a distributed multi-phase clock generator.

Examples are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be included in a computing device or an integrated circuit.

In the discussion, unless otherwise stated, adjectives such as "substantially" and "about" modifying a condition or relationship characteristic of a feature or features of an embodiment of the disclosure are understood to mean that the condition or characteristic is defined to be within tolerances that are acceptable for operation of the embodiment for an application for which the embodiment is intended. In addition, the verb "coupled" should be understood to mean directly connected or connected via circuitry and/or wires that do not substantially alter the characteristics of the signals being communicated between two circuits and/or circuit blocks.

In many integrated circuits/systems, it is desirable to generate timing references that are suitable for sampling at the bit rate (e.g., an 80 MHz sample clock) from a low-frequency clock (e.g., 10 MHZ.) These high-frequency sampling clocks may be distributed to various locations on an integrated circuit. This distribution can add timing errors between the distributed copies of the clocks. These timing errors can limit the performance of the data transmission and reception systems.

In an embodiment, multiple, distributed, clock generating delay-locked loop (DLL) elements are interconnected/coupled in such a way as to provide for the distribution of clocks to various locations on an integrated circuit while at the same time reducing the phase errors present in the clocks. For example, a number of DLL elements may be interconnected/coupled such that a root input clock is successively relayed down a series of DLL elements. The output clocks from each of these DLL elements are interconnected/coupled such that the amount of phase error on these output clocks is reduced (when compared to DLL elements that are not coupled this way.)

Each of these DLL elements includes a DLL, and one or more controllable variable delay elements that are not part of the DLL's feedback loop. The DLL's also include one or more controllable variable delay elements (e.g., a voltage-controlled variable delay cell—VCDC) that are part of the DLL's feedback loop. The variable delay elements that are part of the DLL feedback loop generate the multiple clock signals output by the DLL element.

For example, each DLL element may output M number (where M≥4) of output clocks that are generated from a root input clock. In an embodiment, the M output clocks collectively provide signals that are evenly spaced over the period of the root input clock. In other words, certain edges (e.g., rising, falling, or both) of the M output clocks divide the period of root input clock signal into 360/M degree intervals.

The M clock signals are generated by the variable delay elements that are part of the DLL feedback loop. A signal that is varied by the DLL (e.g., the output of a loop filter) controls the delay of all of the variable delay elements in the DLL element—whether or not these variable delay elements are part of the DLL feedback loop. At least one of the non-DLL feedback loop delay elements is used to delay the input to the DLL element thereby producing a root clock output signal that is provided to the next DLL element in the series. Thus, the root clock output signal of a particular DLL element is a version of the root clock input signal that has been delayed by one 360/M degree interval.

In order to reduce the largely uncorrelated random phase errors that arise between the output clocks of the DLL elements, the M output clocks of the DLL elements are coupled/interconnected. A respective output clock of each successive element is coupled to the output clock of the previous DLL that nominally matches the timing of that output clock. In other words, when there is a 360/M degree delay between the root input clock of a first DLL element and the next (second) DLL element, the second output clock of the first DLL element (i.e., the output clock that is delayed by 2×360/M degrees from its root input clock) is coupled to the first output clock of the second DLL element (i.e., the output clock that is delayed by 1×360/M degrees from its root input clock); the third output clock of the first DLL element (i.e., the output clock that is delayed by 3×360/M degrees from its root input clock) is coupled to the first output clock of the second DLL element (i.e., the output clock that is delayed by 2×360/M degrees from its root input clock), and so on. In an embodiment, the first output clock (i.e., the output clock that is delayed by 1×360/M degrees from its root input clock) of the first DLL element is coupled to the $M^{th}$ output clock (i.e., the output clock that is delayed by (M+1)×360/M=360 which is equivalent to 1×360/M degrees from its root input clock) of the second DLL element. Thus, the largely uncorrelated random clock phase errors at the DLLs' output clocks prior to the described coupling are effectively averaged after coupling, thereby substantially reducing these phase errors.

FIG. 1 is a block diagram illustrating a distributed multi-phase clock generator. In FIG. 1, distributed clock generator 100 comprises DLL element 111 and DLL element 112. DLL element 111 receives a differential master input clock, via signals MCK and /MCK, at inputs RCKI and /RCKI to DLL element 111. DLL element 111 produces six multiphase clock signals via outputs CK[0:5]. DLL element 111 also provides differential output clock signal, RCK1 and /RCK1, via root clock outputs RCKO and /RCKO.

DLL element 112 receives the differential root clock signals from RCK1 and /RCK1 via inputs RCKI and /RCKI to DLL element 112. RCK1 is coupled to the RCKI input of DLL element 112 via interconnect 156. /RCK1 is coupled to the /RCKI input of DLL element 112 via interconnect 157. Clock output CK[0] of DLL element 111 is coupled to clock output CK[5] of DLL element 112 via interconnect 150. Clock output CK[1] of DLL element 111 is coupled to clock output CK[0] of DLL element 112 via interconnect 151. Clock output CK[2] of DLL element 111 is coupled to clock output CK[1] of DLL element 112 via interconnect 152. Clock output CK[3] of DLL element 111 is coupled to clock output CK[2] of DLL element 112 via interconnect 153. Clock output CK[4] of DLL element 111 is coupled to clock output CK[3] of DLL element 112 via interconnect 154. Clock output CK[5] of DLL element 111 is coupled to clock output CK[4] of DLL element 112 via interconnect 155. Interconnect 150-157 may each have parasitic resistances and/or capacitances.

DLL element 111 includes delay-locked loop 140-1, delay element 120-1, and delay element 121-1. DLL 140-1 includes delay element 122-1, delay element 123-1, delay element 124-1, and phase detector and loop filter (PD & LF) circuitry 130-1. Delay elements 120-1 through 124-1 all receive a control signal CTL1 from PD & LF circuitry 130-1. Control signal CTL1 determines the delay of signals propagating through each respective delay element 120-1 through 124-1. Thus, since each of delay elements 120-1 through 124-1 is receiving the same control signal (CTL1), the delay provided by each delay element 120-1 through 124-1 is substantially the same when the delay elements have substantially the same capacitive load at their outputs.

In an embodiment, the loading on the outputs of delay elements 120-1 through 124-1 is configured to be substantially the same. Thus, for example, an additional delay element (not shown in FIG. 1) may be coupled to the output of delay element 124-1, and clock distribution buffers (e.g., inverters) may be coupled to CK[0:5] that are sized to present loading substantially equal to that presented by a delay element. Other ways of equalizing the loading on the outputs of delay elements 120-1 through 124-1 may be employed such as additional capacitors, resistor, and/or dummy transistors.

The differential inputs to delay element 120-1, IN and /IN, are coupled to root clock inputs RCKI and /RCKI, respectively. The differential outputs from delay element 120-1, OUT and /OUT, are coupled to RCKO and /RCKO, respectively, to provide the signals RCK1 and /RCK1, respectively. Thus, the differential root clock output signal of DLL element 111 is a version of the master input clock provided to DLL element 111 that has been delayed by the delay of delay element 120-1.

The differential inputs to delay element 121-1, IN and /IN, are coupled to root clock outputs RCKO and /RCKO of DLL element 111, respectively. The OUT output from delay element 121-1 is connected to clock output CK[3] of DLL element 111. The /OUT output from delay element 121-1 is connected to clock output CK[0] of DLL element 111. Thus, the clock outputs CK[0] and CK[3] of DLL element 111 are versions of the master input clock (MCK, /MCK) provided to DLL element 111 that have been delayed by the delays of delay elements 120-1 and 121-1 (a total of two delays from the master input clock).

The differential inputs to delay element 122-1, IN and /IN, are coupled to clock outputs CK[0] and CK[3] of DLL element 111, respectively. The OUT output from delay element 122-1 is connected to clock output CK[1] of DLL element 111. The /OUT output from delay element 122-1 is connected to clock output CK[4] of DLL element 111. Thus, the clock outputs CK[1] and CK[4] of DLL element 111 are versions of the master input clock provided to DLL element 111 that have been delayed by the delays of delay elements 120-1, 121-1 and 122-1 (a total of three delays from the master input clock).

The differential inputs to delay element 123-1, IN and /IN, are coupled to clock outputs CK[4] and CK[1], respectively. The OUT output from delay element 123-1 is connected to clock output CK[5] of DLL element 111. The /OUT output from delay element 123-1 is connected to clock output CK[2] of DLL element 111. Thus, the clock outputs CK[2] and CK[5] of DLL element 111 are versions of the master input clock provided to DLL element 111 that have been delayed by the delays of delay elements 120-1, 121-1, 122-1 and 123-1 (a total of four delays from the master input clock).

The differential inputs to delay element 124-1, IN and /IN, are coupled to clock outputs CK[2] and CK[5], respectively. The OUT output from delay element 124-1 is connected to signal TK3-1 of DLL element 111. The /OUT output from delay element 124-1 is connected to signal TK0-1 of DLL element 111. Thus, the signals TK0-1 and TK3-1 of DLL element 111 are versions of the master input clock provided to DLL element 111 that have been delayed by the delays of delay elements 120-1, 121-1, 122-1, 123-1, and 124-1 (a total of five delays from the master input clock).

The clock output CK[0] of DLL element 111 is coupled to the IN0 input of PD & LF circuitry 130-1. The clock output CK[3] of DLL element 111 is coupled to the /IN0 input of PD & LF circuitry 130-1. Signal TK0-1 of DLL element 111 is coupled to the IN1 input of PD & LF circuitry 130-1. Signal TK3-1 of DLL element 111 is coupled to the /IN1 input of PD & LF circuitry 130-1. PD & LF circuitry 130-1 compares the timing of the transitions on its first differential input (IN0 and /IN0) to the transitions on its second differential input (IN1 and /IN1) to produce the control signal CTL1 on its output CNTL. PD & LF circuitry 130-1 generates CTL1 from the transitions on its inputs (IN0, /IN0, IN1, and /IN1) such that the total delay of delay elements 122-1, 123-1 and 124-1 is ½ of the period of the master input clock provided to DLL element 111. Thus, when DLL 140-1 is locked, each of delay elements 120-1 through 124-1 provides a delay interval that is equal to (or substantially equal to) ⅙ of the period of the master input clock provided to DLL element 111 when the loading on each delay element is the same or substantially the same.

DLL element 112 includes delay-locked loop 140-2, delay element 120-2, and delay element 121-2. DLL 140-2 includes delay element 122-2, delay element 123-2, delay element 124-2, and phase detector and loop filter (PD & LF) circuitry 130-2. Delay elements 120-2 through 124-2 all receive control signal CTL2 from PD & LF circuitry 130-2. Control signal CTL2 determines the delay of signals propagating through each respective delay element 120-2 through 124-2. Thus, since each of delay elements 120-2 through 124-2 receives the same control signal (CTL2), the delay provided by each delay element 120-2 through 124-2 is substantially the same when the loading on each delay element is the same or substantially the same.

The differential inputs to delay element 120-2, IN and /IN, are coupled to signals RCK1 and /RCK1 produced by DLL element 111, respectively. The differential outputs from delay element 120-2, OUT and /OUT, are coupled to root clock outputs RCKO and /RCKO, respectively, of DLL element 112 to produce the root clock signals RCK2 and /RCK2, respectively. Thus, the differential root clock output signal of DLL element 112 is a version of the master input clock (i.e., MCK and /MCK) provided to DLL element 111 that has been delayed by the delays of delay element 120-1 and 120-2 (a total of two total delays from the master input clock).

The differential inputs to delay element 121-2, IN and /IN, are coupled to root clock outputs RCKO and /RCKO of DLL element 112, respectively. The OUT output from delay element 121-2 is connected to clock output CK[3] of DLL element 112. The /OUT output from delay element 121-2 is connected to clock output CK[0] of DLL element 112. Thus, the clock outputs CK[0] and CK[3] of DLL element 112 are versions of the master input clock provided to DLL element 111 that have been delayed by the delays of delay elements 120-1, 120-2 and 121-2 (a total of three delays from the master input clock).

The differential inputs to delay element 122-2, IN and /IN, are coupled to clock outputs CK[0] and CK[3] of DLL element 112, respectively. The OUT output from delay element 122-2 is connected to clock output CK[1] of DLL element 112. The /OUT output from delay element 122-2 is connected to clock output CK[4] of DLL element 112. Thus, the clock outputs CK[1] and CK[4] of DLL element 112 are versions of the master input clock provided to DLL element 112 that have been delayed by the delays of delay elements 120-1, 120-2, 121-2 and 122-2 (a total of four delays from the master input clock).

The differential inputs to delay element 123-2, IN and /IN, are coupled to clock outputs CK[4] and CK[1], respectively. The OUT output from delay element 123-2 is connected to clock output CK[5] of DLL element 112. The /OUT output from delay element 123-2 is connected to clock output CK[2] of DLL element 112. Thus, the clock outputs CK[2] and CK[5] of DLL element 112 are versions of the master input clock provided to DLL element 112 that have been delayed by the delays of delay elements 120-1, 120-2, 121-2, 122-2 and 123-2 (a total of five delays from the master input clock).

The differential inputs to delay element 124-2, IN and /IN, are coupled to clock outputs CK[2] and CK[5], respectively. The OUT output from delay element 124-2 is connected to signal TK3-2 of DLL element 112. The /OUT output from delay element 124-2 is connected to signal TK0-2 of DLL element 112. Thus, the signals TK0-2 and TK3-2 of DLL element 112 are versions of the master input clock provided to DLL element 112 that have been delayed by the delays of delay elements 120-1, 120-2, 121-2, 122-2, 123-2 and 124-2 (a total of six delays from the master input clock).

The clock output CK[0] of DLL element 112 is coupled to the IN0 input of PD & LF circuitry 130-2. The clock output CK[3] of DLL element 112 is coupled to the /IN0 input of PD & LF circuitry 130-2. Signal TK0-2 of DLL element 112 is coupled to the IN1 input of PD & LF circuitry 130-2. Signal TK3-2 of DLL element 112 is coupled to the /IN1 input of PD & LF circuitry 130-2. PD & LF circuitry 130-2 compares the timing of the transitions on its first differential input (IN0 and /IN0) to the transitions on its second differential input (IN1 and /IN1) to produce the control signal CTL2 on its output CNTL. PD & LF circuitry 130-2 generates CTL2 from the transitions on its inputs (IN0, /IN0, IN1, and /IN1) such that the total delay of delay elements 122-2, 123-2 and 124-2 is ½ of a period of the master input clock provided to DLL element 112. Thus, when DLL 140-2 is locked, each of delay elements 121-2 through 124-2 provide a delay interval that is equal to (or substantially equal to) ⅙ of the period of the root input clock provided to DLL element 112 when the loading on each delay element is the same or substantially the same.

Additional DLL elements (not shown in FIG. 1), may be connected in a likewise manner. For example, a third DLL element may receive the differential root clock signals from RCKO and /RCKO of DLL element 112. Clock output CK[0] of DLL element 112 may be coupled to clock output CK[5] of the third DLL element via an interconnect conductor. Clock output CK[1] of DLL element 112 may be coupled to clock output CK[0] of the third DLL element via an interconnect conductor. Clock output CK[2] of DLL element 112 may be coupled to clock output CK[1] of the third DLL element via an interconnect conductor. Clock output CK[3] of DLL element 112 may be coupled to clock output CK[2] of the third DLL element via an interconnect conductor. Clock output CK[4] of DLL element 112 may be coupled to clock output CK[3] of the third DLL element via an interconnect conductor. Clock output CK[5] of DLL element 112 may be coupled to clock output CK[4] of the third DLL element via an interconnect conductor. These interconnect conductors may all have respective parasitic resistances and/or capacitances.

Thus, it should be understood that a first aspect is that the DLL elements (e.g., DLL elements 111 and 112) include clock signal inputs RCKI and /RCKI; a 1st controlled delay element 120 used to generate root clock output signals RCK1 and /RCK1 from the master input clock; 2nd, 3rd, and 4th controlled delay element 121 through 123 to generate global and coupled clock signal outputs CK[5:0]; a 5th controlled delay element 124 to generate local, uncoupled clock signals for phase comparison to global clock signals CK[0] and CK[3]; and phase detector and loop filter (PS & LF) 130 to ensure that that CK[5:0] are evenly spaced over 360 degrees. A sixth controlled delay element (not shown in FIG. 1) may be used as a dummy load for the output of controlled delay element 124. An alternative embodiment may use CK[1,2,4,5] and the outputs of controlled delay element 124 as global coupled clock signals, and CK[0,3] as local clock signals for phase comparison.

A second aspect is the arraying of multiple instances of the DLL elements (e.g., DLL elements 111 and 112) with a specific interconnection of array instance pins. A feature of the circuit illustrated in FIG. 1 is that with the 6 clock outputs CK[5:0] of DLL element 111 shorted to the 6 clock outputs CK[4:0,5] of DLL element 112, the largely uncorrelated random clock phase errors that arise from these two blocks of circuitry are effectively averaged and thereby substantially reduced.

Simulation results of at least one implementation show a 40% reduction in random clock phase error using the methods described herein when 6 DLL elements are coupled. When 12 DLL elements are coupled, a 58% clock phase error reduction is observed. When compared to clock distribution via chains of inverters or buffers, this is a large benefit that comes at virtually no cost in power, complexity or bandwidth, and at a modest cost in circuit area (e.g., for replica phase detectors, charge pumps and loop filters in each DLL element).

In an embodiment, a distributed multi-phase clock generator can comprise N delay-locked loop elements that each produce M output clocks. For example, distributed clock generator 100 of FIG. 1 illustrates an example multi-phase clock generator that has N=2 DLL elements that each produce M=6 output clocks. Each of the N delay-locked loop elements has a root clock input and a root clock output. The N delay-locked loop elements are numbered n=1 to N in order of ascending phase at the root clock input. Thus, for the example of clock generator 100, DLL element 111 would be numbered n=1, and DLL element 112 would be numbered n=2.

For each delay-locked loop element, the root clock output of the delay-locked loop element numbered n is coupled to the root clock input of the delay-locked loop element numbered n+1, except when n=N. Thus, the root clock output of DLL element 111 (numbered n=1) is coupled to the root clock input of DLL element 112. In addition, since in FIG. 1 there are no additional DLL elements illustrated, the root clock output of DLL element 112 (numbered n=N=2) is not connected to anything in FIG. 1. The root clock input of the delay-locked loop element numbered n=1 receives a master input clock. Thus, in FIG. 1, DLL element 111 receives the master input clock signal.

Each delay-locked loop element may be configured to produce M output clocks. In FIG. 1, this is shown by DLL element 111 and DLL element 112 each producing M=6 clocks, CK[0:5]. N may be an integer greater than one (e.g., N=2). M may be an even integer greater than three (e.g., M=4, M=6, M=8, etc.) Each of the M output clocks of a respective delay-locked loop element may have a phase. In FIG. 1, the six clocks output by DLL element 111 and/or DLL element 112 are evenly distributed over the period of the master input clock: CK[0] has a phase of 0° relative to the root clock output signal of the DLL element, CK[1] has a phase of 360/M=60°, CK[2] has a phase of 2×360/M=120°, CK[3] has a phase of 180°; CK[4] has a phase of 240°, and CK[5] has a phase of 300°, and TK0 has a phase of 360°—which is equivalent to a phase of 0°.

The M output clocks of each DLL element may be numbered m=1 to M in order of ascending phase. The phase of a respective output clock numbered m+1 substantially equals the phase of a respective output clock numbered m plus 360/M degrees. For FIG. 1, this is illustrated by the relationship, for example, of CK[3] having a phase of 180° and CK[4] having a phase of 240°, the difference of these two phases being: 240°−180°=60°=360°/6.

Each respective output clock numbered m of the respective delay-locked loop element numbered n is coupled to output clock numbered m−1 of delay-locked loop element numbered n+1, except that when m=1 the respective output clock numbered m=1 is coupled to the output clock numbered m=M of delay-locked loop element numbered n+1. In FIG. 1, this is illustrated by CK[1] of DLL element 111 (corresponding to n=1) being coupled by interconnect 151 to CK[0] of DLL element 112 (corresponding to n=2); CK[2] of DLL element 111 (corresponding to n=1) being coupled by interconnect 152 to CK[1] of DLL element 112 (corresponding to n=2), and so on. CK[0] (corresponding to m=1) of DLL element 111 in FIG. 1, is coupled to CK[5] of DLL element 112 by interconnect 150.

The phase of a respective root clock output signal substantially equals the phase of a respective root clock input signal plus 360/M degrees. In FIG. 1, this is accomplished for DLL element 111 by controllable delay element 120-1. Delay element 120-1 has a delay interval equal to that of delay elements 121-1 through 124-1 and is controlled by PD & LF 130-1 to be 360°/6=60°.

The delay-locked loop elements may each include a first delay cell, a second delay cell, a delay line having (M/2)−1 main delay cells, a last delay cell, a phase detector, and a loop filter. In FIG. 1, this is illustrated, for example, by delay element 120-1 (first delay cell), delay element 121-1 (second delay cell), delay elements 122-1 through 123-1 (forming a delay line having (6/2)−1=2 delay elements), delay element 124-1 (last delay cell), and PD & LF 130-1 (phase detector and loop filter). Each of the first delay cell, second delay cell, main delay cells, and last delay cell include a delay control input. In FIG. 1, this is illustrated, for example, by each of delay elements 120-1 through 124-1 having a control input, "CTL" that determines the delay of all of delay elements 120-1 through 124-1.

The first delay cell may be coupled between the root clock input and the root clock output. In FIG. 1, this is illustrated, for example, by delay element 120-1 which receives the master input clock and produces RCK1 and /RCK1. The main delay cells may be series-coupled between the root clock input and the last delay cell. In FIG. 1, this is illustrated, for example, by delay element 121-1 receiving the master input clock and the series-coupling of the of delay elements 121-1 through 123-1. The last delay cell may be coupled between the main delay cells and the phase detector. In FIG. 1, this is illustrated, for example, by delay element 124-1 receiving the output of delay element 123-1 and providing TK0-1 and TK3-1 to PD & LF 130-1. The loop filter may be coupled between the phase detector and the delay control input of each of the first delay cell, main delay cells, and the last delay cell. In FIG. 1, this is illustrated, for example, by delay elements 121-1 through 124-1 each receiving the signal CTL1 from PD & LF 130-1.

In an embodiment, each of the first delay cell, main delay cells, and the last delay cell may include a true input, a complement input, a true output, and a complement output. In FIG. 1, this is illustrated, for example, by delay elements 120-1 through 124-1 each having an input IN (true input) an input /IN (complement input), an output OUT (true output), and an output /OUT (complement output).

The true output of the first delay cell of a delay-locked loop element numbered n may be coupled to the true input of the delay-locked loop element number n+1. Also, the complement output of the first delay cell of the delay-locked loop element number n is coupled to the complement input of the delay-locked loop element numbered n+1. In FIG. 1, this is illustrated, for example, by delay element 120-1 of DLL element 111 having its OUT output coupled to the IN input of delay element 120-2 of DLL element 112 and delay element 120-1 of DLL element 111 having its/OUT output coupled to the /IN input of delay element 120-2 of DLL element 112.

It should also be understood that the example clock generator illustrated in FIG. 1 uses differential signaling. However, single-ended signaling could be used with appropriate changes to PD & LF 130-1 and delay elements 120-1 through 124-1 (and, in an embodiment, a different number of delay elements—for example increased, decreased, or odd).

In another embodiment, a distributed multi-phase clock generator may include a first delay-locked loop element to receive a master input clock and to produce a first set of at least M output clocks. In FIG. 1, DLL element 111 receives a master input clock (MCK and /MCK) at the RCKI and /RCKI inputs to DLL element 111. DLL element 111 also produces M=6 output clocks CK[0:5]. The first set of output clocks may be delay-locked with the master input clock such that the master input clock is divided into M number of time intervals. In FIG. 1, the output clocks CK[0:5] produced by DLL element 111 are delay-locked with the master input clock by DLL 140-1, and the DLL feedback loop of DLL 140-1 includes PD & LF 130-1. This feedback loop sets the delay of delay elements 122-1 through 124-1 such that the output clock signals CK[0:5] each transition at times that are regularly spaced over the period of the master input clock (MCK, /MCK). In particular, when DLL 140-1 is locked, a given edge (rising or falling) of each of CK[0:5] produced by DLL element 111 occur at different times that are evenly spaced over the 360° period of the master input clock (which is also the period of clocks CK[0:5]). For example, if CK[0] as output by DLL element 111 is taken to be the 0° reference, then CK[1:5] as output by DLL element 111 would be spaced as follows: CK[1] would be at 60°; CK[2] would be at 120°; CK[3] would be at 180°; CK[4] would be at 240°; and, CK[5] would be at 300°.

A second delay-locked loop element may receive a second input clock from the first delay-locked loop element. In FIG. 1, DLL element 112 receives RCK1 and /RCK1 from DLL element 112. The second delay-locked loop element may produce a second set of at least M output clocks. In FIG. 1, DLL element 112 produces M=6 output clocks CK[0:5]. This second set of output clocks may be delay-locked with the second input clock such that the second input clock is divided into M time intervals. In FIG. 1, the output clocks CK[0:5] produced by DLL element 112 are delay-locked with the master input clock by DLL 140-2, and the DLL feedback loop that includes PD & LF 130-2, in particular. This feedback loop sets the delay of delay elements 122-2 through 124-2 such that the output clock signals CK[0:5] each transition at times that are regularly spaced over the period of the root input clock (RCK1, /RCK1). In particular, when DLL 140-2 is locked, a given edge (rising or falling) of each of CK[0:5] produced by DLL element 112 occur at different times that are evenly spaced over the 360° period of the root input clock (which is also the period of clocks CK[0:5]). For example, if CK[5] as output by DLL element 111 is taken to be the 0° reference, then CK[0:4] as output by DLL element 112 would be spaced as follows: CK[0] would be at 60°; CK[1] would be at 120°; CK[2] would be at 180°; CK[3] would be at 240°; and, CK[4] would be at 300°.

The second input clock may correspond to the master input clock delayed by one of the M time intervals. In FIG.

1, the clock input to DLL element 112 are the signals RCK1 and /RCK1 which are a version of the master input clock that has been delayed by delay element 120-1 by one 360°/M=60° time interval. Respective ones of the first set of output clocks and the second set of output clocks are coupled. This coupling is configured such that the first set of output clocks are each coupled to the second set of output clocks such that output clocks with corresponding phase are coupled together. In FIG. 1, interconnect 150-155 couples respective ones of the CK[0:5] signals produced by DLL element 111 to respective ones of the CK[0:5] signals produced by DLL element 112 such that the coupled signals correspond to each other in phase. For example, if the master input clock (i.e., MCK, /MCK) is taken to be the 0° reference, then CK[0] of DLL element 111 would be at 60° from the master clock and is therefore coupled to CK[5] of DLL element 112 (which also at a phase of 420°−360°=60° from the master clock); CK[1] of DLL element 111 would be at 120° from the master input clock and is therefore coupled to CK[0] of DLL element 112 (which also has a phase of 120° from the master input clock); CK[2] of DLL element 111 would be at 180° from the master input clock and is therefore coupled to CK[1] of DLL element 112 (which also has a phase of 180° from the master input clock); and so on.

The distributed multi-phase clock generator may also include a third delay-locked loop element to receive a third input clock from the second delay-locked loop element. Thus, the RCKO, /RCKO outputs (i.e., RCK2, /RCK2 signals) from DLL element 112 may be provided to a third delay-locked loop element (not shown in FIG. 1). Similar to DLL element 112's relationship to DLL element 111, this third delay-locked loop element may produce a third set of at least M output clocks. The third set of output clocks may be delay-locked with the third input clock such that the third input clock is divided into M time intervals. This third input clock may correspond to the master input clock delayed by two of the M intervals. The coupling between respective ones of the second set of output clocks and the third set of output clocks is configured such that the second set of output clocks are each coupled to the third set of output clocks such that clocks with corresponding phase are coupled together.

The first delay-locked loop element and the second delay-locked loop element may be part of a set of N delay-locked loop elements (where N is a positive integer greater or equal to 2). These N delay-locked loop elements may each include a delay-locked loop and a root variable delay. The delay-locked loop may include M variable delay elements that each produce a corresponding output clock. The root variable delay element may be configured to receive a root clock input signal and to produce root clock output signal that may be provided to a next delay-locked loop element. In FIG. 1, where N=2 for the elements actually shown in FIG. 1, DLL element 111 includes root variable delay 120-1 and DLL 140-1. DLL element 112 includes root variable delay 120-1 and DLL 140-2.

The root variable delay element of the first delay-locked loop element receives the master input clock as the root input clock and produces the second input clock. For example, DLL element 111 receives the master input clock (MCK, /MCK) and produces the root clock output signal (RCK1, /RCK1) that is provided to DLL element 112. The delay-locked loop element may further include a phase detector and a loop filter. The phase detector may receive an output of at least one of the M variable delay elements. The loop filter may receive the output of the phase detector to produces a control signal. This control signal may be provided to the root variable delay element and the M variable delay elements to control the root variable delay element delay and the respective M variable delay elements delays of the delay-locked loop to have substantially the same delay.

For example, PD & LF 130-1 may include a phase detector and a loop filter. The phase detector of PD & LF 130-1 receives the output of delay element 121-1 and 124-1. The loop filter of PD & LF 130-1 produces, from a signal provided by the phase detector of PD & LF 130-1, the control signal CTL1. The control signal CTL1 controls all of the delay elements 121-1 through 124-1 (via their CTL input) to have substantially the same delay (because they are receiving the same control signal and are, in an embodiment, identical circuits fabricated relatively close to each other on the same integrated circuit die). In an embodiment, N>1 and M is an even integer greater than 3.

Figure 2:
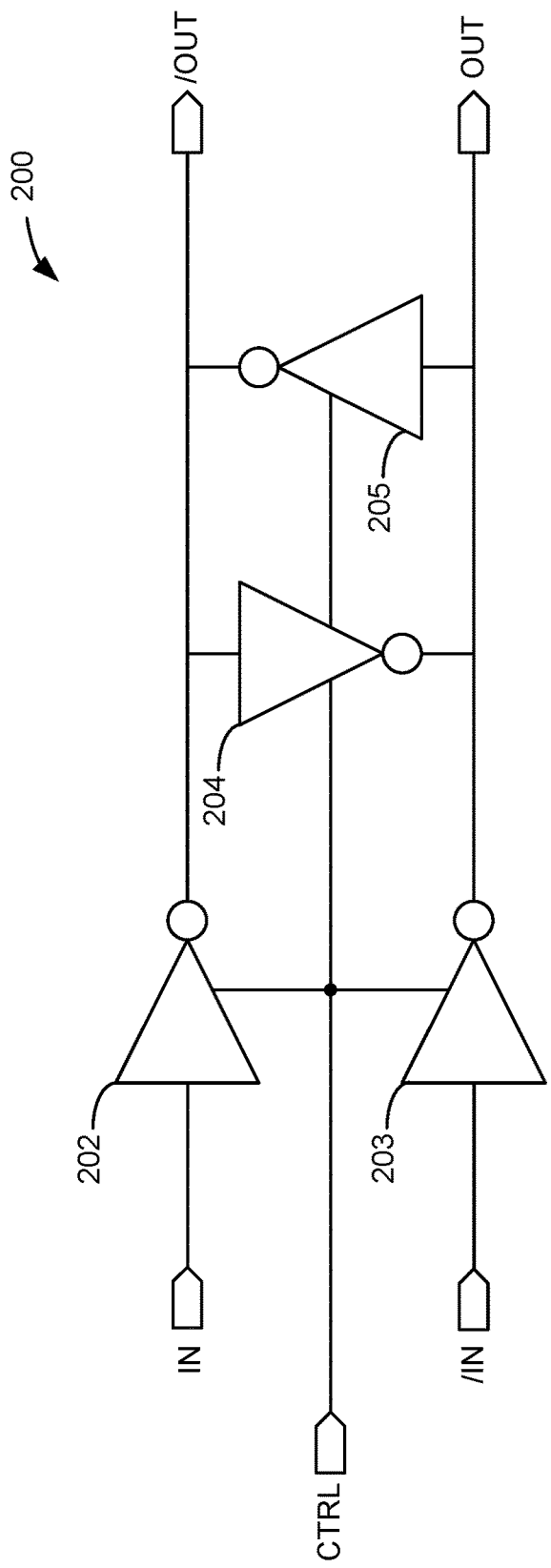
FIG. 2 is a schematic diagram illustrating an example variable delay element.

FIG. 2 is a schematic diagram illustrating an example variable delay element. In FIG. 2, delay element 200 comprises inverter 202, inverter 203, inverter 204, and inverter 205. Inverter 202 receives the signal in the input IN and drives the output node/OUT. Inverter 203 receives the signal in the input/IN and drives the output node OUT. Inverter 204 receives the signal on the output node/OUT and drives the output node OUT. Inverter 205 receives the signal on the output node OUT and drives the output node/OUT. Each of inverters 202-205 also receives the control signal from the control input CTL. The control signal CTL controls the switching time of each of inverters 202-205. Thus, the control signal CTL controls the delay of delay element 200. In an embodiment, control signal CTL is one or more analog voltage signals and delay element 200 may be referred to as a voltage-controlled delay cell (VCDC). In another embodiment, control signal CTL is one or more analog current signals and delay element 200 may be referred to as a current controlled delay cell (CCDC). In another embodiment, control signal CTL is one or more digital signals and delay element 200 may be referred to as a digitally-controlled delay cell. In yet another embodiment, control signal CTL is a combination of analog signals and digital signals.

Figure 3:
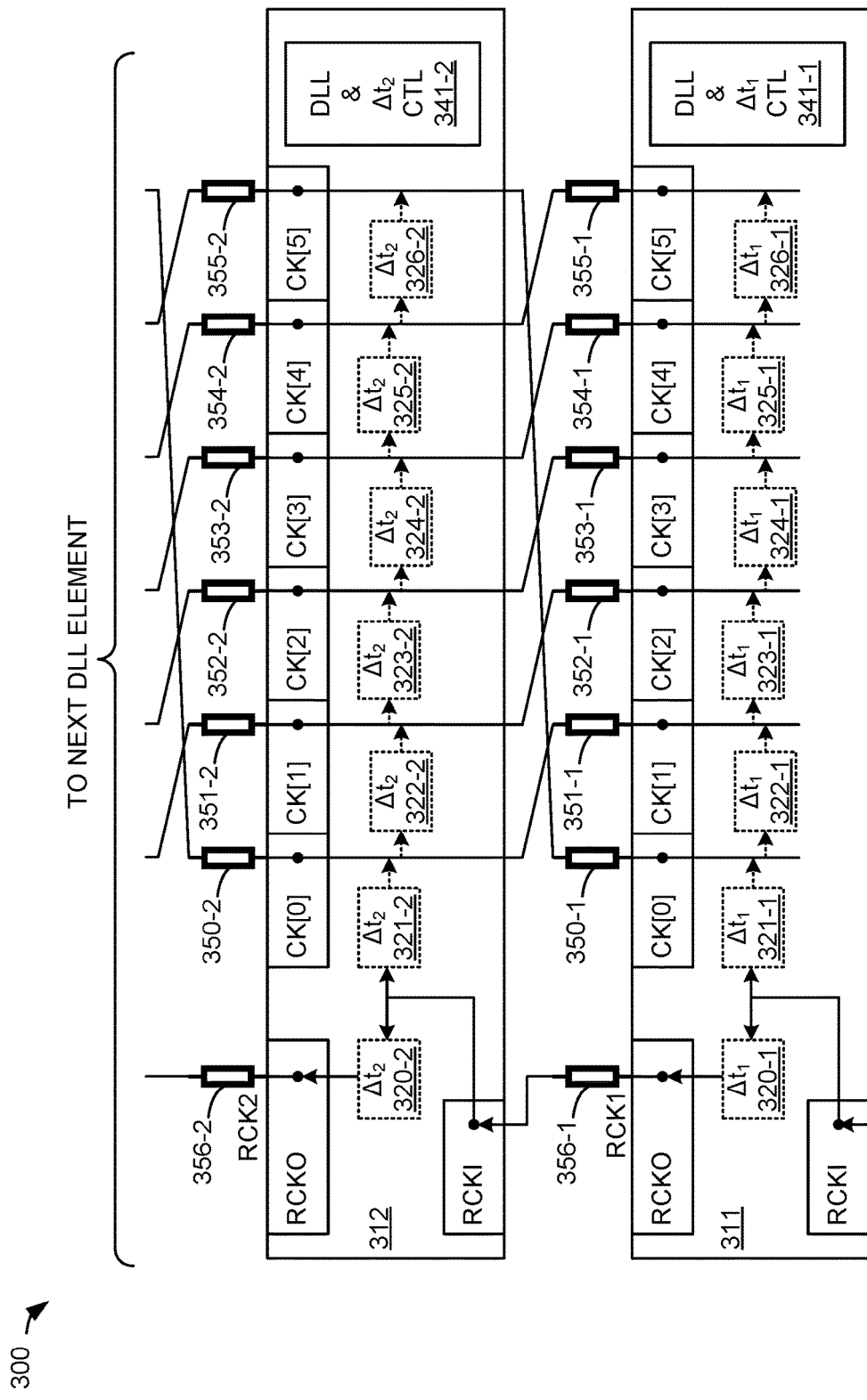
FIG. 3 is a block diagram illustrating a distributed multi-phase clock generator.

FIG. 3 is a block diagram illustrating a distributed multi-phase clock generator. In FIG. 3, distributed clock generator 300 comprises DLL element 311 and DLL element 312. DLL element 311 receives master input clock MCK at input RCKI. DLL element 311 produces six multiphase clock signals via outputs CK[0:5]. DLL element 311 also provides a clock signal RCK1 via root clock output RCKO.

DLL element 312 receives the root clock signal RCK1 via input RCKI. RCK1 is coupled to the RCKI input of DLL element 312 via interconnect 356-1. Clock output CK[0] of DLL element 311 is coupled to clock output CK[5] of DLL element 312 via interconnect 350-1. Clock output CK[1] of DLL element 311 is coupled to clock output CK[0] of DLL element 312 via interconnect 351-1. Clock output CK[2] of DLL element 311 is coupled to clock output CK[1] of DLL element 312 via interconnect 352-1. Clock output CK[3] of DLL element 311 is coupled to clock output CK[2] of DLL element 312 via interconnect 353-1. Clock output CK[4] of DLL element 311 is coupled to clock output CK[3] of DLL element 312 via interconnect 354-1. Clock output CK[5] of DLL element 311 is coupled to clock output CK[4] of DLL element 312 via interconnect 355-1. Interconnect 350-1 through 356-1 may each have parasitic resistances and/or capacitances.

DLL element 311 includes delay elements 320-1 through 325-1, and delay-locked loop (DLL) and first time delay ($\Delta t_1$) control circuitry 341-1. Delay elements 320-1 through 326-1 are all controlled by circuitry 341-1 to have substantially the same amount of delay.

The input to delay element 320-1 is coupled to root clock input RCKI of DLL element 311. The output from delay element 320-1 is coupled to RCKO to provide the signal RCK1. Thus, the root clock output of DLL element 311 is a version of the master input clock MCK that was provided to DLL element 311 that has been delayed by the $\Delta t_1$ delay of delay element 320-1.

The input to delay element 321-1 is coupled to root clock input RCKI of DLL element 311. The output from delay element 321-1 is connected to clock output CK[0] of DLL element 311. Thus, the clock output CK[0] produced by DLL element 311 is a version of the master input clock provided to DLL element 311 that has been delayed by the $\Delta t_1$ delay of delay element 321-1.

The input to delay element 322-1, is coupled to clock output CK[0] of DLL element 311. The output from delay element 322-1 is connected to clock output CK[1] of DLL element 311. Thus, the clock output CK[1] of DLL element 311 is a version of the master input clock MCK provided to DLL element 311 that has been delayed by the $\Delta t_1$ delays of delay elements 321-1 and 322-1 (a total of two $\Delta t_1$ delays from the master input clock).

The input to delay element 323-1, is coupled to clock output CK[1]. The output from delay element 323-1 is connected to clock output CK[2] of DLL element 311. Thus, the clock output CK[2] of DLL element 311 is a version of the master input clock MCK provided to DLL element 311 that has been delayed by the $\Delta t_1$ delays of delay elements 321-1, 322-1, and 323-1 (a total of three $\Delta t_1$ delays from the master input clock).

The input to delay element 324-1, is coupled to clock output CK[2]. The output from delay element 324-1 is connected to clock output CK[3] of DLL element 311. Thus, the clock output CK[3] of DLL element 311 is a version of the master input clock MCK provided to DLL element 311 that has been delayed by the $\Delta t_1$ delays of delay elements 321-1, 322-1, 323-1, and 324-1 (a total of four $\Delta t_1$ delays from the master input clock).

The input to delay element 325-1, is coupled to clock output CK[3]. The output from delay element 325-1 is connected to clock output CK[4] of DLL element 311. Thus, the clock output CK[4] of DLL element 311 is a version of the master input clock MCK provided to DLL element 311 that has been delayed by the $\Delta t_1$ delays of delay elements 321-1, 322-1, 323-1, 324-1, and 325-1 (a total of five $\Delta t_1$ delays from the master input clock).

The input to delay element 326-1, is coupled to clock output CK[4]. The output from delay element 326-1 is connected to clock output CK[5] of DLL element 311. Thus, the clock output CK[5] of DLL element 311 is a version of the master input clock MCK provided to DLL element 311 that has been delayed by the $\Delta t_1$ delays of delay elements 321-1, 322-1, 323-1, 324-1, 325-1, and 326-1 (a total of six $\Delta t_1$ delays from the master input clock).

Circuitry 341-1 compares the timing of the transitions of at least two signals (e.g., CK[0] and CK[5], or RCK1 and CK[5], etc.) to the control the total delay of delay elements 321-1 through 325-1 to be substantially equal to the period (a.k.a. cycle time) of the master input clock provided to DLL element 311. Thus, when DLL element 311 is locked, each of delay elements 321-1 through 325-1 substantially provide a $\Delta t_1$ delay interval that is equal to (or substantially equal to) ⅙ of the period of the master input clock provided to DLL element 311.

DLL element 312 is configured and operates in a similar manner to DLL element 311, except that DLL element 312 receives the root clock signal provided by DLL element 311.

Additional DLL elements (not shown in FIG. 3), may be connected in a likewise manner. For example, the next DLL element may receive the root clock signal RCK2. Clock output CK[0] of DLL element 312 may be coupled to clock output CK[5] of the next DLL element via an interconnect conductor 350-2. Clock output CK[1] of DLL element 312 may be coupled to clock output CK[0] of the next DLL element via an interconnect conductor 351-2. Clock output CK[2] of DLL element 312 may be coupled to clock output CK[1] of the next DLL element via an interconnect conductor 352-2. Clock output CK[3] of DLL element 312 may be coupled to clock output CK[2] of the next DLL element via an interconnect conductor 353-2. Clock output CK[4] of DLL element 112 may be coupled to clock output CK[3] of the next DLL element via an interconnect conductor 354-2. Clock output CK[5] of DLL element 112 may be coupled to clock output CK[4] of the next DLL element via an interconnect conductor 355-2. These interconnect conductors 350-1 through 356-1 and 350-2 through 356-2 may all have respective parasitic resistances and/or capacitances.

Figure 4:
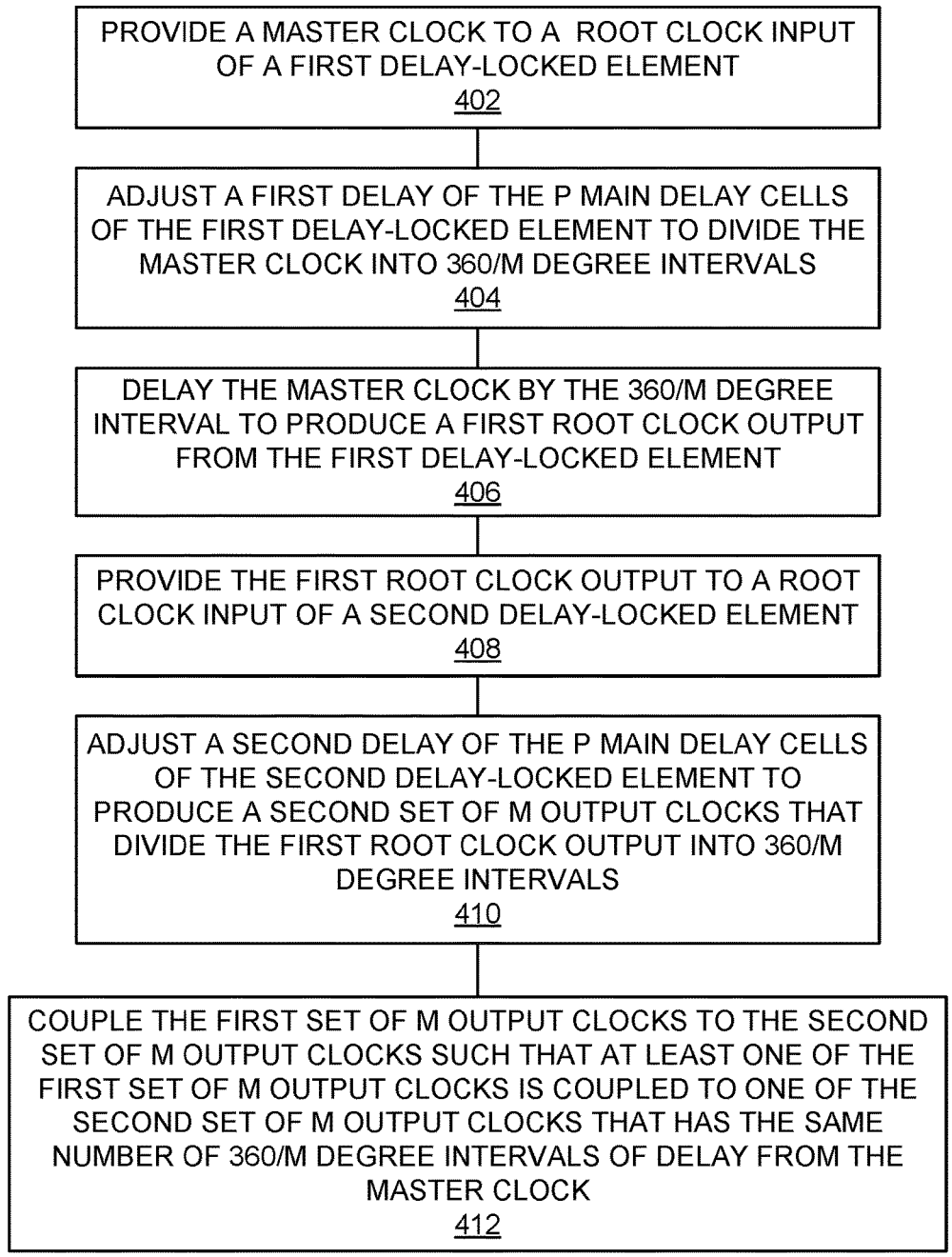
FIG. 4 is a flowchart illustrating of a method of generating distributed multi-phase clock signals.

FIG. 4 is a flowchart illustrating of a method of generating distributed multi-phase clock signals. The steps illustrated in FIG. 4 may be performed by one or more elements of distributed clock generator 100 and/or distributed clock generator 300. A master clock signal is provided to a root clock input of a first delay-locked loop element (402). For example, a master input clock (MCK, /MCK) may be provided to the root clock input (RCKI, /RCKD of DLL element 111. A first delay of the P delay cells of the first delay-locked loop element is adjusted to produce a first set of M output clocks that divide the master clock into 360/M degree intervals (404). For example, PD & LF 130-1 may adjust the delay of delay elements 122-1 through 124-1 (i.e., P=3) in order to produce output clock signals CK[0:5] (i.e., M=6) from DLL element 111 that divide the master clock into 360°/M=360°/6=60 degree intervals. In another example, control circuitry 341-1 may adjust the $\Delta t_1$ delay of delay elements 321-1 through 326-1 in order to produce output clock signals CK[0:5] (i.e., M=6) from DLL element 311 that divide the master clock into 360°/M=360°/6=60 (i.e., M=6) degree intervals.

The master clock is delayed by the 360/M interval to produce a first root clock output signal from the first delay-locked loop element (406). For example, the master input clock (MCK, /MCK) may be delayed by delay element 120-1 in order to output a first root clock output signal (RCK1, /RCK1) at the root clock output (i.e., RCKO, /RCKO) of DLL element 111. The first root clock output signal is provided to a root clock input of a second delay-locked loop element (408). For example, the first root clock output signal (RCK1, /RCK1) may be coupled to the root clock input (RCKI, /RCKI) of DLL element 111 via interconnect (156, 157).

A second delay of the P delay cells of the second delay-locked loop element is adjusted to produce a second set of M output clocks that divide the first root clock output signal into 360/M degree intervals (410). For example, PD & LF 130-2 may adjust the delay of delay elements 122-2 through 124-2 (i.e., P=3) in order to produce output clock signals CK[0:5] (i.e., M=6) from DLL 112 that divide the first root clock signal (RCK1, /RCK1) into 360°/M=360°/6=60 degree intervals. In another example, control circuitry 341-1 may adjust the $\Delta t_2$ delay of delay elements 321-2 through 326-2 in order to produce output clock signals CK[0:5] (i.e., M=6) from DLL element 311 that divide the first root clock output signal RCK1 into 360°/M=360°/6=60 degree intervals.

The first set of M output clocks is coupled to the second set of M output clocks such that at least one of the first set of M output clocks is coupled to one of the second set of M output clocks that has the same number of 360/M degree intervals of delay from the master clock (412). For example, the CK[0] produced by DLL element 111 is coupled to the CK[5] produced by DLL element 112 by interconnect 150.

Figure 5:
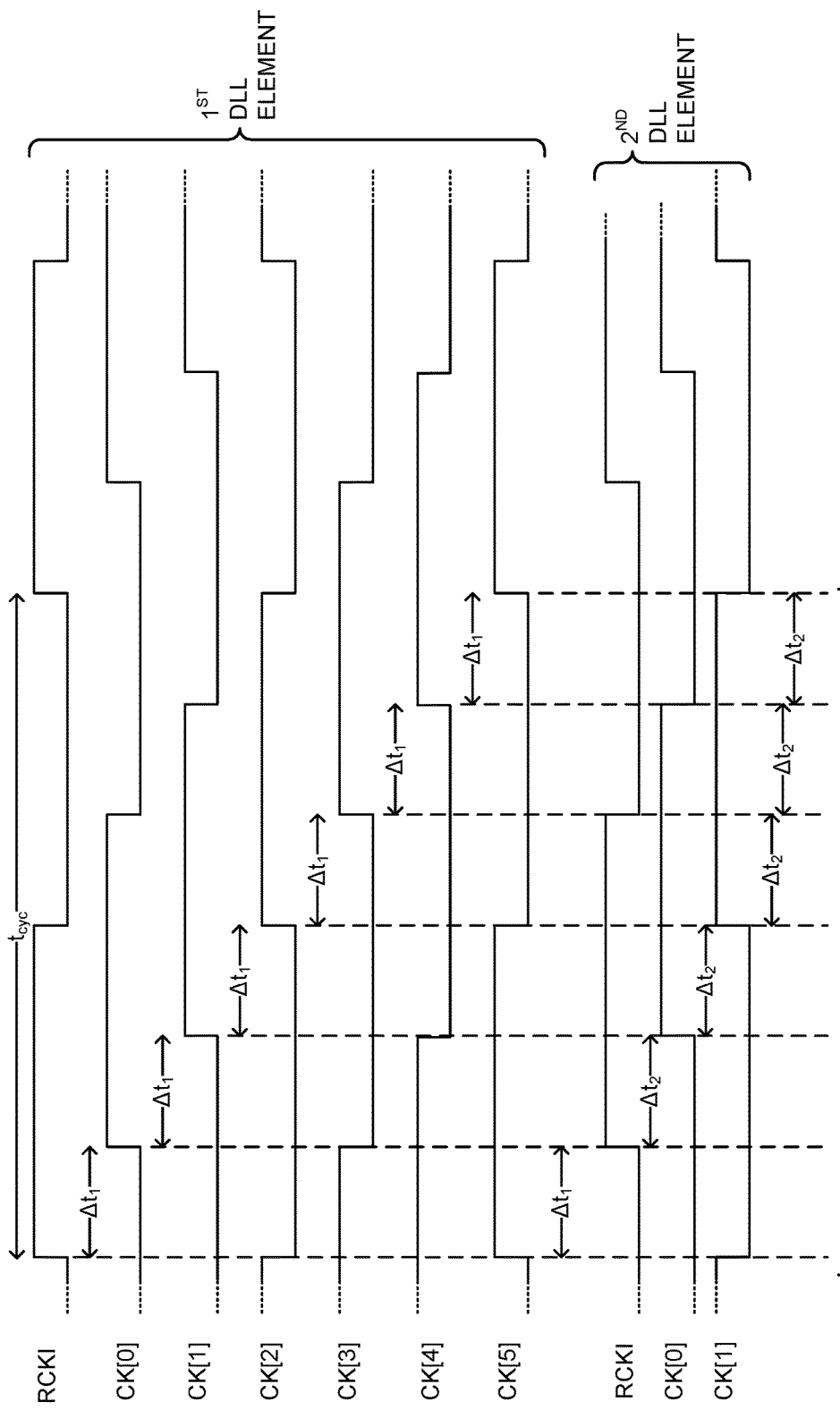
FIG. 5 is a timing diagram illustrating relationships between single-ended distributed clock signals.

FIG. 5 is a timing diagram illustrating relationships between single-ended distributed clock signals. In FIG. 5, the root clock input signal to the 1$^{st}$ DLL element is cycling with a period of $t_{CYC}$. Since the first DLL element (e.g., DLL element 311) produces M output clocks that divide the first root clock input signal RCKI into 360°/M degree intervals, there are M number of the $\Delta t_1$ delays from an edge of CK[0] to CK[M−1]. In FIG. 5, a case where M=6 is illustrated. Thus, in FIG. 5, $6\times\Delta t_1 = t_{CYC}$ with the CK[0:5] signals successively transitioning every $\Delta t_1$ time interval over the period ($t_{CYC}$) of the root clock input signal RCKI.

Figure 6:
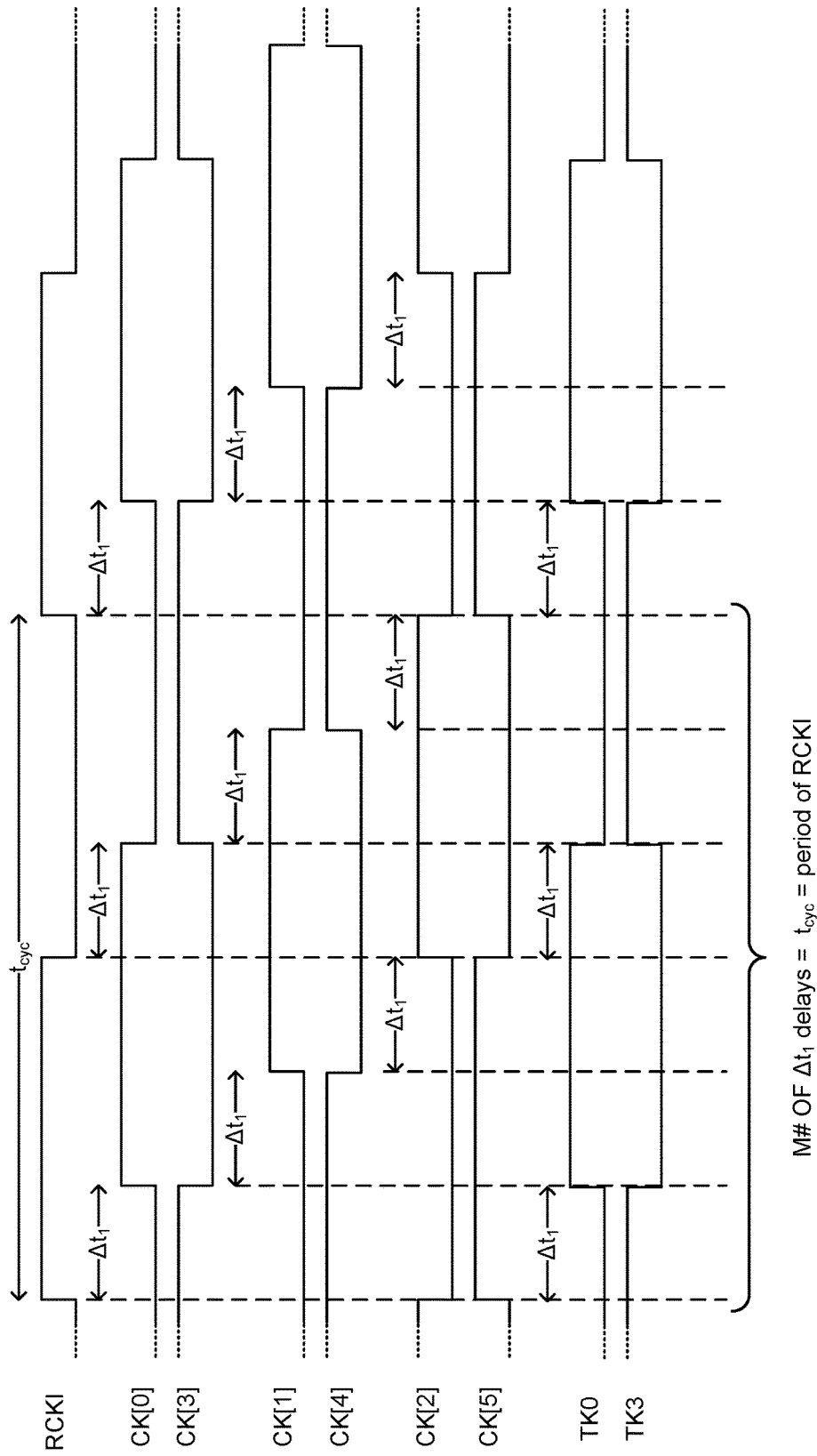
FIG. 6 is a timing diagram illustrating relationships between differential distributed clock signals.

FIG. 6 is a timing diagram illustrating relationships between differential distributed clock signals. In FIG. 6, the root clock input signal to the 1$^{st}$ DLL element is cycling with a period of $t_{CYC}$. Since the first DLL element (e.g., DLL element 311) produces M output clocks that divide the first root clock input signal RCKI into 360°/M degree intervals, there are M number of the $\Delta t_1$ delays from an edge of CK[0] to the same edge of CK[M−1]. In FIG. 6, a case where M=6 is illustrated. Thus, in FIG. 6, $6\times\Delta t_1 = t_{CYC}$ with the CK[0:5] signals successively transitioning every $\Delta t_1$ time interval over the period ($t_{CYC}$) of the root clock input signal RCKI. However, it should be understood that for differential signaling, each output clock CK[0:5] has a corresponding output clock that is 180° (a.k.a. inverted) from that clock. Thus, CK[0] and CK[3] are inversions of each other, CK[1] and CK[4] are inversions of each other, and so on.

Figure 7:
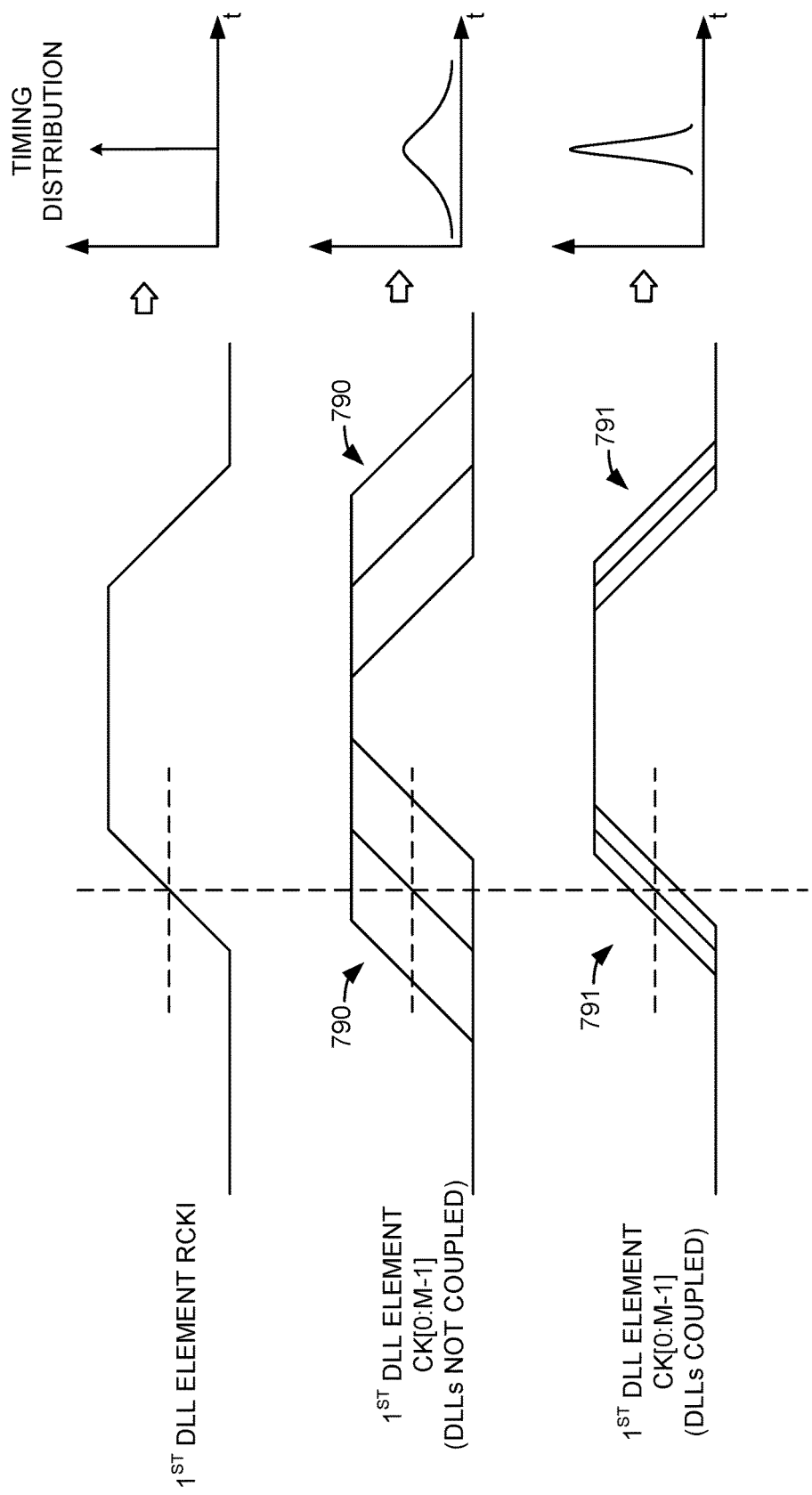
FIG. 7 illustrates a reduction in phase errors.

FIG. 7 illustrates a reduction in phase errors. In FIG. 7, a rising and falling edge of the master input clock (RCKI) is illustrated. If the output clocks CK[0:M−1] are not coupled to another DLL element, the phase errors present on these output clocks is shown by the uncertainty in the transition 790 and the wide normal distribution of the timing of transition 790. If the output clocks CK[0:M−1] are coupled to the output clocks of another DLL element(s), the phase errors present on these output clocks is shown by the uncertainty in the transition 791—where the amount (i.e., time interval) of uncertainty 791 is smaller than the amount of uncertainty 790 and the normal distribution of the timing of transition 791 is narrower than the distribution of the timing of transition 790. This is because the largely uncorrelated random clock phase errors that arise between distributed DLL elements (i.e., DLL element circuit blocks that have some physical distance between them on the integrated circuit die) are effectively averaged thereby substantially reducing these phase errors.

Figure 8:
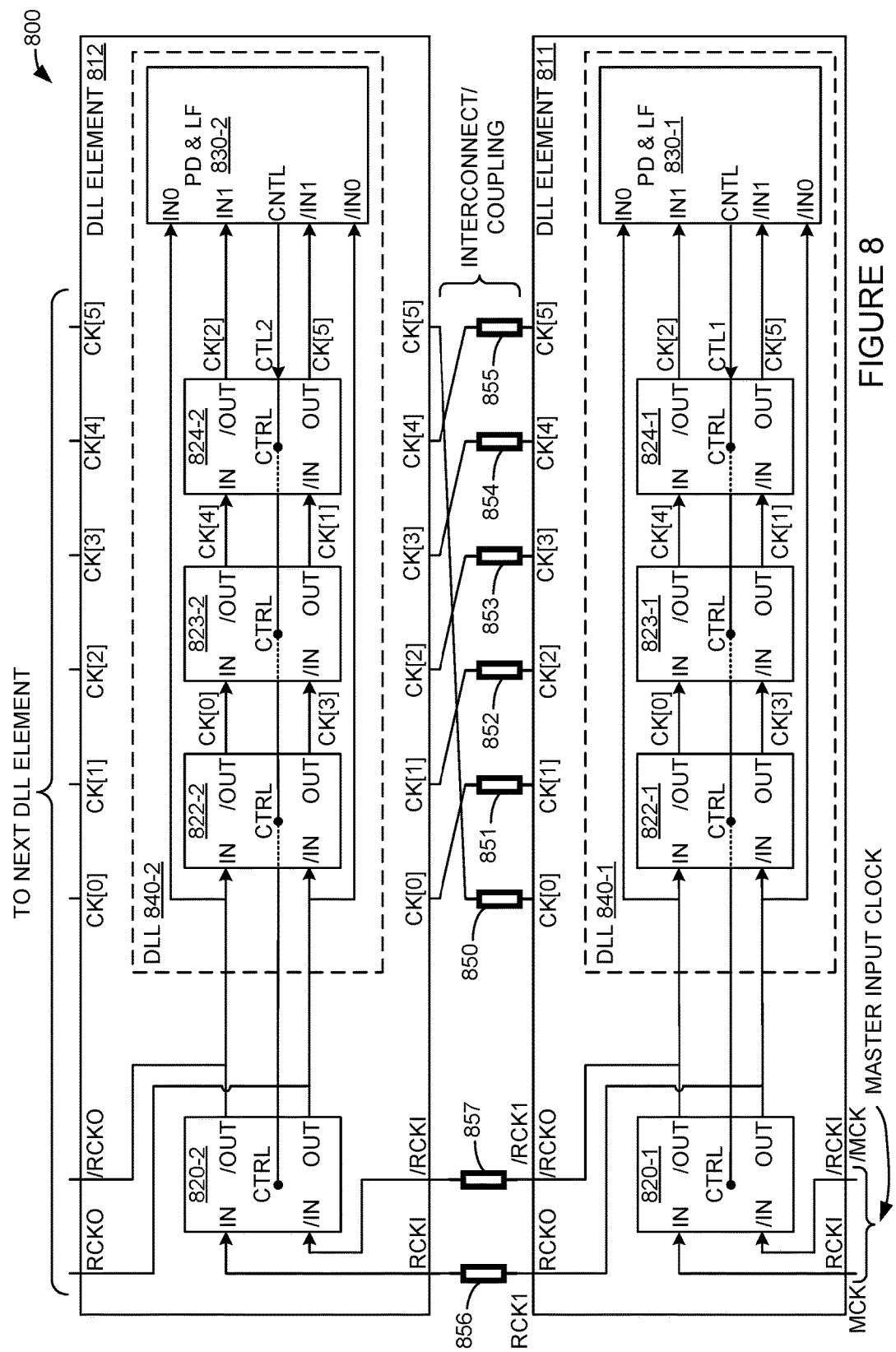
FIG. 8 is a block diagram illustrating an embodiment of a distributed multi-phase clock generator.

FIG. 8 is a block diagram illustrating an embodiment of a distributed multi-phase clock generator. In FIG. 8, distributed clock generator 800 comprises DLL element 811 and DLL element 812. DLL element 811 receives a differential master input clock, via signals MCK and /MCK, at inputs RCKI and /RCKI to DLL element 811. DLL element 811 produces six multiphase clock signals via outputs CK[0:5]. DLL element 811 also provides differential output clock signal, RCK1 and /RCK1, via root clock outputs RCKO and /RCKO.

DLL element 812 receives the differential root clock signals from RCK1 and /RCK1 via inputs RCKI and /RCKI to DLL element 812. RCK1 is coupled to the RCKI input of DLL element 812 via interconnect 856. /RCK1 is coupled to the /RCKI input of DLL element 812 via interconnect 857.

Clock output CK[0] of DLL element 811 is coupled to clock output CK[5] of DLL element 812 via interconnect 850. Clock output CK[1] of DLL element 811 is coupled to clock output CK[0] of DLL element 812 via interconnect 851. Clock output CK[2] of DLL element 811 is coupled to clock output CK[1] of DLL element 812 via interconnect 852. Clock output CK[3] of DLL element 811 is coupled to clock output CK[2] of DLL element 812 via interconnect 853. Clock output CK[4] of DLL element 811 is coupled to clock output CK[3] of DLL element 812 via interconnect 854. Clock output CK[5] of DLL element 811 is coupled to clock output CK[4] of DLL element 812 via interconnect 855. Interconnect 850-857 may each have parasitic resistances and/or capacitances.

DLL element 811 includes delay-locked loop 840-1 and delay element 820-1. DLL 840-1 includes delay element 822-1, delay element 823-1, delay element 824-1, and phase detector and loop filter (PD & LF) circuitry 830-1. Delay elements 820-1, 822-1, 823-1, and 824-1 all receive a control signal CTL1 from PD & LF circuitry 830-1. Control signal CTL1 determines the delay of signals propagating through each respective delay element 820-1, 822-1, 823-1, and 824-1. Thus, since each of delay elements 820-1, 822-1, 823-1, and 824-1 is receiving the same control signal (CTL1), the delay provided by each delay element 820-1, 822-1, 823-1, and 824-1 is substantially the same when the delay elements have substantially the same capacitive load at their outputs.

In an embodiment, the loading on the outputs of delay elements 820-1, 822-1, 823-1, and 824-1 is configured to be substantially the same. Thus, for example, an additional delay element (not shown in FIG. 8) may be coupled to the output of delay element 824-1, and clock distribution buffers (e.g., inverters) may be coupled to CK[0:5] that are sized to present loading substantially equal to that presented by a delay element. Other ways of equalizing the loading on the outputs of delay elements 820-1, 822-1, 823-1, and 824-1 may be employed such as additional capacitors, resistor, and/or dummy transistors.

The differential inputs to delay element 820-1, IN and /IN, are coupled to root clock inputs RCKI and /RCKI, respectively. The differential outputs from delay element 820-1, OUT and /OUT, are coupled to RCKO and /RCKO, respectively, to provide the signals RCK1 and /RCK1, respectively. Thus, the differential root clock output signal of DLL element 811 is a version of the master input clock provided to DLL element 811 that has been delayed by the delay of delay element 820-1.

The differential inputs to delay element 822-1, IN and /IN, are coupled to root clock outputs RCKO and /RCKO of DLL element 811, respectively. The OUT output from delay element 822-1 is connected to clock output CK[3] of DLL element 811. The /OUT output from delay element 822-1 is connected to clock output CK[0] of DLL element 811. Thus, the clock outputs CK[0] and CK[3] of DLL element 811 are versions of the master input clock (MCK, /MCK) provided to DLL element 811 that have been delayed by the delays of delay elements 820-1 and 822-1 (a total of two delays from the master input clock).

The differential inputs to delay element 823-1, IN and /IN, are coupled to clock outputs CK[0] and CK[3] of DLL element 811, respectively. The OUT output from delay element 823-1 is connected to clock output CK[1] of DLL element 811. The /OUT output from delay element 823-1 is connected to clock output CK[4] of DLL element 811. Thus, the clock outputs CK[1] and CK[4] of DLL element 811 are versions of the master input clock provided to DLL element 811 that have been delayed by the delays of delay elements 820-1, 822-1 and 823-1 (a total of three delays from the master input clock).

The differential inputs to delay element 824-1, IN and /IN, are coupled to clock outputs CK[4] and CK[1], respectively. The OUT output from delay element 824-1 is connected to clock output CK[5] of DLL element 811. The /OUT output from delay element 824-1 is connected to clock output CK[2] of DLL element 811. Thus, the clock outputs CK[2] and CK[5] of DLL element 811 are versions of the master input clock provided to DLL element 811 that have been delayed by the delays of delay elements 820-1, 822-1, 823-1 and 824-1 (a total of four delays from the master input clock).

The clock output /RCK1 of DLL element 811 is coupled to the IN0 input of PD & LF circuitry 830-1. The clock output RCK1 of DLL element 811 is coupled to the /IN0 input of PD & LF circuitry 830-1. Clock ouput CK[2] of element 811 is coupled to the IN1 input of PD & LF circuitry 830-1. Clock output CK[5] of DLL element 811 is coupled to the /IN1 input of PD & LF circuitry 830-1. PD & LF circuitry 830-1 compares the timing of the transitions on its first differential input (IN0 and /IN0) to the transitions on its second differential input (IN1 and /IN1) to produce the control signal CTL1 on its output CNTL. PD & LF circuitry 830-1 generates CTL1 from the transitions on its inputs (IN0, /IN0, IN1, and /IN1) such that the total delay of delay elements 822-1, 823-1 and 824-1 is ½ of the period of the master input clock provided to DLL element 811. Thus, when DLL 840-1 is locked, each of delay elements 820-1, 822-1, 823-1 and 824-1 provides a delay interval that is equal to (or substantially equal to) ⅙ of the period of the master input clock provided to DLL element 811 when the loading on each delay element is the same or substantially the same.

DLL element 812 includes delay-locked loop 840-2 and delay element 820-2. DLL 840-2 includes delay element 822-2, delay element 823-2, delay element 824-2, and phase detector and loop filter (PD & LF) circuitry 830-2. Delay elements 820-2, 822-2, 823-2 and 824-2 all receive control signal CTL2 from PD & LF circuitry 830-2. Control signal CTL2 determines the delay of signals propagating through each respective delay element 820-2, 822-2, 823-2 and 824-2. Thus, since each of delay elements 820-2, 822-2, 823-2 and 824-2 receive the same control signal (CTL2), the delay provided by each delay element 820-2, 822-2, 823-2 and 824-2 is substantially the same when the loading on each delay element is the same or substantially the same.

The differential inputs to delay element 820-2, IN and /IN, are coupled to signals RCK1 and /RCK1 produced by DLL element 811, respectively. The differential outputs from delay element 820-2, OUT and /OUT, are coupled to root clock outputs RCKO and /RCKO, respectively, of DLL element 812 to produce the root clock signals RCK2 and /RCK2, respectively. Thus, the differential root clock output signal of DLL element 812 is a version of the master input clock (i.e., MCK and /MCK) provided to DLL element 811 that has been delayed by the delays of delay element 820-1 and 820-2 (a total of two total delays from the master input clock).

The differential inputs to delay element 822-2, IN and /IN, are coupled to root clock outputs RCKO and /RCKO of DLL element 812, respectively. The OUT output from delay element 822-2 is connected to clock output CK[3] of DLL element 812. The /OUT output from delay element 822-2 is connected to clock output CK[0] of DLL element 812. Thus, the clock outputs CK[0] and CK[3] of DLL element 812 are versions of the master input clock provided to DLL element 811 that have been delayed by the delays of delay elements 820-1, 820-2 and 822-2 (a total of three delays from the master input clock).

The differential inputs to delay element 823-2, IN and /IN, are coupled to clock outputs CK[0] and CK[3] of DLL element 812, respectively. The OUT output from delay element 823-2 is connected to clock output CK[1] of DLL element 812. The /OUT output from delay element 823-2 is connected to clock output CK[4] of DLL element 812. Thus, the clock outputs CK[1] and CK[4] of DLL element 812 are versions of the master input clock provided to DLL element 812 that have been delayed by the delays of delay elements 820-1, 820-2, 822-2 and 823-2 (a total of four delays from the master input clock).

The differential inputs to delay element 824-2, IN and /IN, are coupled to clock outputs CK[4] and CK[1], respectively. The OUT output from delay element 824-2 is connected to clock output CK[5] of DLL element 812. The /OUT output from delay element 824-2 is connected to clock output CK[2] of DLL element 812. Thus, the clock outputs CK[2] and CK[5] of DLL element 812 are versions of the master input clock provided to DLL element 812 that have been delayed by the delays of delay elements 820-1, 820-2, 822-2, 823-2 and 824-2 (a total of five delays from the master input clock).

The clock output /RCKO of DLL element 812 is coupled to the IN0 input of PD & LF circuitry 830-2. The clock output RCKO of DLL element 812 is coupled to the /IN0 input of PD & LF circuitry 830-2. Clock output CK[2] of DLL element 812 is coupled to the IN1 input of PD & LF circuitry 830-2 Clock output CK[5] of DLL element 812 is coupled to the /IN1 input of PD & LF circuitry 830-2. PD & LF circuitry 830-2 compares the timing of the transitions on its first differential input (IN0 and /IN0) to the transitions on its second differential input (IN1 and /IN1) to produce the control signal CTL2 on its output CNTL. PD & LF circuitry 830-2 generates CTL2 from the transitions on its inputs (IN0, /IN0, IN1, and /IN1) such that the total delay of delay elements 822-2, 823-2 and 824-2 is ½ of a period of the master input clock provided to DLL element 812. Thus, when DLL 840-2 is locked, each of delay elements 820-2, 822-2, 823-2 and 824-2 provide a delay interval that is equal to (or substantially equal to) ⅙ of the period of the root input clock provided to DLL element 812 when the loading on each delay element is the same or substantially the same.

Additional DLL elements (not shown in FIG. 8), may be connected in a likewise manner. For example, a third DLL element may receive the differential root clock signals from RCKO and /RCKO of DLL element 812. Clock output CK[0] of DLL element 812 may be coupled to clock output CK[5] of the third DLL element via an interconnect conductor. Clock output CK[1] of DLL element 812 may be coupled to clock output CK[0] of the third DLL element via an interconnect conductor. Clock output CK[2] of DLL element 812 may be coupled to clock output CK[1] of the third DLL element via an interconnect conductor. Clock output CK[3] of DLL element 812 may be coupled to clock output CK[2] of the third DLL element via an interconnect conductor. Clock output CK[4] of DLL element 812 may be coupled to clock output CK[3] of the third DLL element via an interconnect conductor. Clock output CK[5] of DLL element 812 may be coupled to clock output CK[4] of the third DLL element via an interconnect conductor. These interconnect conductors may all have respective parasitic resistances and/or capacitances.

In an embodiment, a multi-phase clock generator to generate N*M output clocks comprises: N delay-locked loop elements, each delay-locked loop element having a root clock input and a root clock output, the N delay-locked loop elements being numbered n=1 to N in order of ascending phase at the root clock input; for each delay-locked loop element, the root clock output of the delay-locked loop element numbered n is coupled to the root clock input of the delay-locked loop element numbered n+1, except when n=N; the root clock input of the delay-locked loop element numbered n=1 receives a master input clock; each delay-locked loop element is configured to produce M output clocks; N is an integer greater than one; M is an even integer greater than three; each of the M output clocks of a respective delay-locked loop element has a phase; the M output clocks are numbered m=1 to M in order of ascending phase; the phase of a respective output clock numbered m+1 substantially equals the phase of a respective output clock numbered m plus 360/M degrees; each respective output clock numbered m of the respective delay-locked loop element numbered n is coupled to output clock numbered m-1 of delay-locked loop element numbered n+1, except that when m=1 the respective output clock numbered m=1 is coupled to the output clock numbered m=M of delay-locked loop element numbered n+1; and, the phase of a respective root clock output substantially equals the phase of a respective root clock input plus 360/M degrees.

In an embodiment, the delay-locked loop elements each comprise: a first delay cell; a second delay cell; a delay line having (M/2)−1 main delay cells; a last delay cell; a phase detector; and, a loop filter. In an embodiment, each of the first delay cell, second delay cell, main delay cells, and last delay cell include a delay control input; the first delay cell is coupled between the root clock input and the root clock output; the second delay cell is coupled between the root clock output and the main delay cells; the main delay cells are series-coupled between the second delay cell and the last delay cell; the last delay cell is coupled between the main delay cells and the phase detector; the phase detector is coupled between the second delay cell, the last delay cell, and the loop filter; and, the loop filter is coupled between the phase detector and the delay control input of each of the first delay cell, the second delay cell, the main delay cells, and the last delay cell.

In an embodiment, a delay of each of the first delay cell, second delay cell, main delay cells, and last delay cell are determined by an output of the loop filter. In an embodiment, each of the first delay cell, second delay cell, main delay cells, and last delay cell include a true input, a complement input, a true output, and a complement output. In an embodiment, for at least one of the N delay-locked loop elements, the complement output of the first delay cell of the delay-locked loop element numbered n is coupled to the complement input of the first delay cell of the delay-locked loop element numbered n+1, and the true output of the first delay cell of the delay-locked loop element numbered n is coupled to the true input of the first delay cell of the delay-locked loop element numbered n+1.

In an embodiment, the root clock input receives a first single-ended type clock signal; the root clock output produces second single-ended type clock signal; and, each of the first delay cell, second delay cell, main delay cells, and last delay cell include a delay control input, a single-ended input, and a single-ended output.

In an embodiment, a distributed multi-phase clock generator comprises: a first delay-locked loop element to receive a master input clock and to produce a first set of at least M output clocks, the first set of output clocks to be delay-locked to the master input clock such that the master input clock is divided into M time intervals; a second delay-locked loop element to receive a second input clock from the first delay-locked loop element, the second delay-locked loop element to produce a second set of at least M output clocks, the second set of output clocks to be delay-locked to the second input clock such that the second input clock is divided into M time intervals, the second input clock to correspond to the master input clock delayed by one of the M time intervals; and, coupling between respective ones of the first set of output clocks and the second set of output clocks, the coupling configured such that the first set of output clocks are each coupled to the second set of output clocks such that output clocks with corresponding phase are coupled together.

In an embodiment, the distributed multi-phase clock generator further comprises a third delay-locked loop element to receive a third input clock from the second delay-locked loop element, the third delay-locked loop element to produce a third set of at least M output clocks, the third set of output clocks to be delay-locked to the third input clock such that the third input clock is divided into M time intervals, the third input clock to correspond to the master input clock delayed by two of the M intervals; and, coupling between respective ones of the second set of output clocks and the third set of output clocks, the coupling configured such that the second set of output clocks are each coupled to the third set of output clocks such that clocks with corresponding phase are coupled together.

In an embodiment, the first delay-locked loop element and the second delay-locked loop element are part of a set of N delay-locked loop elements, and the N delay-locked loop elements each comprise: a delay-locked loop that includes M variable delay elements each producing a corresponding output clock; and, a root variable delay element configured to receive a root input clock signal and to produce a root clock output signal to be provided to a next delay-locked loop element. In an embodiment, the root variable delay element of the first delay-locked loop element receives the master input clock as the root input clock and produces the second input clock. In an embodiment, the root variable delay element of the second delay-locked loop element receives the second input clock as the root input clock and produces a third input clock.

In an embodiment, the delay-locked loop element further comprises: a phase detector to receive an output of at least one of the M variable delay elements; and, a loop filter that receives the output of the phase detector and produces a control signal, the control signal provided to the root variable delay element and the M variable delay elements to control the root variable delay element delay and the respective M variable delay elements delays of the delay-locked loop to have substantially the same delay. In an embodiment, N is an integer greater than one and M is an even integer greater than 3.

In an embodiment, a method of generating distributed multi-phase output clocks comprises: providing a master input clock to a root clock input of a first delay-locked loop element; adjusting a first delay of P delay cells of the first delay-locked loop element to produce a first set of M output clocks that divide the master input clock into 360/M degree intervals; delaying the master input clock by the 360/M degree interval to produce a first root clock output from the first delay-locked loop element; providing the first root clock output to a root clock input of a second delay-locked loop element; adjusting a second delay of P delay cells of the second delay-locked loop element to produce a second set of M output clocks that divide the first root clock output into 360/M degree intervals; and, coupling the first set of M output clocks to the second set of M output clocks such that at least one of the first set of M output clocks is coupled to one of the second set of M output clocks that has the same number of 360/M intervals of delay from the master input clock.

In an embodiment, the first delay of P delay cells of the first delay-locked loop element is adjusted as part of a first delay-locked feedback loop and the second delay of P delay cells of the second delay-locked loop element is adjusted as part of a second delay-locked feedback loop. In an embodiment, the coupling of the first set of M output clocks to the second set of M output clocks occurs via signal conductors each having a parasitic resistance. In an embodiment using single-ended delay elements, P=M+1. In an embodiment using differential delay elements, P=M/2+1.

In an embodiment, the method of generating distributed multi-phase output clocks further comprises: delaying the first root clock output clock by the 360/M degree interval to produce a second root clock output from the second delay-locked loop element; providing the second root clock output to a root clock input of a third delay-locked loop element; adjusting a third delay of P delay cells of the third delay-locked loop element to produce a third set of M output clocks that divide the second root clock output into 360/M degree intervals; and, coupling the second set of M output clocks to the third set of M output clocks such that at least one of the second set of M output clocks is coupled to one of the third set of M output clocks that has the same number of 360/M intervals of delay from the master input clock.

The foregoing description of the example embodiments have been presented for purposes of illustration and description. It is not intended to be exhaustive or to limit the what is claimed to the precise form disclosed, and other modifications and variations may be possible in light of the above teachings. The embodiments were chosen and described in order to explain the principles herein and their practical application thereby enabling others skilled in the art to utilize the various embodiments and various modifications thereof as are suited to the particular use contemplated. It is intended that the appended claims be construed to include other alternative embodiments except insofar as limited by the prior art.

What is claimed is:

1. A multi-phase clock generator to generate N*M number of output clocks, comprising:
   N number of delay-locked loop elements, each delay-locked loop element having a root clock input and a root clock output, the N delay-locked loop elements being numbered n=1 to N in order of ascending phase at the root clock input;
   for each delay-locked loop element, the root clock output of the delay-locked loop element numbered n is coupled to the root clock input of the delay-locked loop element numbered n+1, except when n=N;
   the root clock input of the delay-locked loop element numbered n=1 receives a master input clock;
   each delay-locked loop element is configured to produce M number of output clocks;
   N is an integer greater than one;
   M is an even integer greater than three;
   each of the M output clocks of a respective delay-locked loop element has a phase;
   the M output clocks are numbered m=1 to M in order of ascending phase;
   the phase of a respective output clock numbered m+1 substantially equals the phase of a respective output clock numbered m plus 360/M degrees;
   each respective output clock numbered m of the respective delay-locked loop element numbered n is coupled to output clock numbered m-1 of delay-locked loop element numbered n+1, except that when m=1 the respective output clock numbered m=1 is coupled to the output clock numbered m=M of delay-locked loop element numbered n+1; and,
   the phase of a respective root clock output substantially equals the phase of a respective root clock input plus 360/M degrees.

2. The multi-phase clock generator of claim 1, wherein the delay-locked loop elements each comprise:
   a first delay cell;
   a second delay cell;
   a delay line having (M/2)–1 main delay cells;
   a last delay cell;
   a phase detector; and,
   a loop filter.

3. The multi-phase clock generator of claim 2, wherein:
   each of the first delay cell, second delay cell, main delay cells, and last delay cell include a delay control input;
   the first delay cell is coupled between the root clock input and the root clock output;
   the second delay cell is coupled between the root clock output and the main delay cells;
   the main delay cells are series-coupled between the second delay cell and the last delay cell;
   the last delay cell is coupled between the main delay cells and the phase detector;
   the phase detector is coupled between the second delay cell, the last delay cell, and the loop filter; and,
   the loop filter is coupled between the phase detector and the delay control input of each of the first delay cell, second delay cell, main delay cells, and last delay cell.

4. The multi-phase clock generator of claim 3, wherein a delay of each of the first delay cell, second delay cell, main delay cells, and last delay cell is determined by an output of the loop filter.

5. The multi-phase clock generator of claim 4, wherein:
   each of the first delay cell, second delay cell, main delay cells, and last delay cell include a true input, a complement input, a true output, and a complement output; and,
   each of the true and complement outputs of the second delay cell and the main delay cells are coupled to one of the M output clocks.

6. The multi-phase clock generator of claim 5, wherein:
   for at least one of the N delay-locked loop elements, the complement output of the first delay cell of the delay-locked loop element numbered n is coupled to the complement input of the first delay cell of the delay-locked loop element numbered n+1, and the true output of the first delay cell of the delay-locked loop element numbered n is coupled to the true input of the first delay cell of the delay-locked loop element numbered n+1.

7. The multi-phase clock generator of claim 4, wherein:
   the root clock input receives a first single-ended type clock signal;
   the root clock output produces second single-ended type clock signal; and,
   each of the first delay cell, second delay cell, main delay cells, and last delay cell include a delay control input, a single-ended input, and a single-ended output.

8. A distributed multi-phase clock generator, comprising:
a first delay-locked loop element to receive a master input clock and to produce a first set of at least M number of output clocks, the first set of output clocks to be delay-locked to the master input clock such that the master input clock is divided into M number of time intervals;
a second delay-locked loop element to receive a second input clock from the first delay-locked loop element, the second delay-locked loop element to produce a second set of at least M output clocks, the second set of output clocks to be delay-locked to the second input clock such that the second input clock is divided into M time intervals, the second input clock to correspond to the master input clock delayed by one of the M time intervals; and,
coupling between respective ones of the first set of output clocks and the second set of output clocks, the coupling configured such that the first set of output clocks are each coupled to the second set of output clocks such that output clocks with corresponding phase are coupled together.

9. The distributed multi-phase clock generator of claim 8, further comprising:
a third delay-locked loop element to receive a third input clock from the second delay-locked loop element, the third delay-locked loop element to produce a third set of at least M output clocks, the third set of output clocks to be delay-locked to the third input clock such that the third input clock is divided into M time intervals, the third input clock to correspond to the master input clock delayed by two of the M intervals; and,
coupling between respective ones of the second set of output clocks and the third set of output clocks, the coupling configured such that the second set of output clocks are each coupled to the third set of output clocks such that clocks with corresponding phase are coupled together.

10. The distributed multi-phase clock generator of claim 8, wherein the first delay-locked loop element and the second delay-locked loop element are part of a set of N delay-locked loop elements, the N delay-locked loop elements each comprising:
a delay-locked loop that includes M variable delay elements each producing a corresponding output clock; and,
a root variable delay element configured to receive a root input clock signal and to produce a root clock output signal to be provided to a next delay-locked loop element.

11. The distributed multi-phase clock generator of claim 10, wherein the root variable delay element of the first delay-locked loop element receives the master input clock as the root input clock and produces the second input clock.

12. The distributed multi-phase clock generator of claim 11, wherein the root variable delay element of the second delay-locked loop element receives the second input clock as the root input clock and produces a third input clock.

13. The distributed multi-phase clock generator of claim 10, wherein the delay-locked loop element further comprises:

a phase detector to receive an output of at least one of the M variable delay elements; and,
a loop filter that receives the output of the phase detector and produces a control signal, the control signal provided to the root variable delay element and the M variable delay elements to control the root variable delay element delay and the respective M variable delay elements delays of the delay-locked loop to have substantially the same delay.

14. The distributed multi-phase clock generator of claim 13, wherein N is an integer greater than one and M is an even integer greater than 3.

15. A method of generating distributed multi-phase output clocks, comprising:
providing a master input clock to a root clock input of a first delay-locked loop element;
adjusting a first delay of P delay cells of the first delay-locked loop element to produce a first set of M output clocks that divide the master input clock into 360/M degree intervals;
delaying the master input clock by the 360/M degree interval to produce a first root clock output from the first delay-locked loop element;
providing the first root clock output to a root clock input of a second delay-locked loop element;
adjusting a second delay of P delay cells of the second delay-locked loop element to produce a second set of M output clocks that divide the first root clock output into 360/M degree intervals; and,
coupling the first set of M output clocks to the second set of M output clocks such that at least one of the first set of M output clocks is coupled to one of the second set of M output clocks that has the same number of 360/M intervals of delay from the master input clock.

16. The method of claim 15, further comprising:
delaying the first root clock output clock by the 360/M degree interval to produce a second root clock output from the second delay-locked loop element;
providing the second root clock output to a root clock input of a third delay-locked loop element;
adjusting a third delay of P delay cells of the third delay-locked loop element to produce a third set of M output clocks that divide the second root clock output into 360/M degree intervals; and,
coupling the second set of M output clocks to the third set of M output clocks such that at least one of the second set of M output clocks is coupled to one of the third set of M output clocks that has the same number of 360/M intervals of delay from the master input clock.

17. The method of claim 15, wherein the first delay of P delay cells of the first delay-locked loop element is adjusted as part of a first delay-locked feedback loop and the second delay of P delay cells of the second delay-locked loop element is adjusted as part of a second delay-locked feedback loop.

18. The method of claim 15, wherein the coupling of the first set of M output clocks to the second set of M output clocks occurs via signal conductors each having a parasitic resistance.

19. The method of claim 15, wherein P>=M+1.

20. The method of claim 15, wherein P>=M/2+1.

* * * * *